(12) United States Patent
Zhou

(10) Patent No.: US 10,858,378 B2
(45) Date of Patent: Dec. 8, 2020

(54) SYNTHESIS OF DISILANYLAMINES THROUGH TRANSAMINATION

(71) Applicant: Dow Silicones Corporation, Midland, MI (US)

(72) Inventor: Xiaobing Zhou, Midland, MI (US)

(73) Assignees: Dow Silicones Corporation, Midland, MI (US); Rohm and Haas Electronic Materials LLC, Marlborough, MA (US)

(*) Notice: Subject to any disclaimer, the term of this patent is extended or adjusted under 35 U.S.C. 154(b) by 0 days.

(21) Appl. No.: 15/779,653

(22) PCT Filed: Dec. 16, 2016

(86) PCT No.: PCT/US2016/067127
§ 371 (c)(1),
(2) Date: May 29, 2018

(87) PCT Pub. No.: WO2017/106615
PCT Pub. Date: Jun. 22, 2017

(65) Prior Publication Data
US 2018/0258107 A1 Sep. 13, 2018

Related U.S. Application Data

(60) Provisional application No. 62/269,286, filed on Dec. 18, 2015.

(51) Int. Cl.
*C07F 7/10* (2006.01)
*C07F 7/20* (2006.01)
*C07F 7/02* (2006.01)
*C07F 7/08* (2006.01)
*C23C 16/34* (2006.01)

(52) U.S. Cl.
CPC ............... *C07F 7/10* (2013.01); *C07F 7/025* (2013.01); *C07F 7/0803* (2013.01); *C07F 7/20* (2013.01); *C23C 16/345* (2013.01)

(58) Field of Classification Search
None
See application file for complete search history.

(56) References Cited

U.S. PATENT DOCUMENTS 9,796,739 B2   10/2017  Xiao et al.

FOREIGN PATENT DOCUMENTS

EP         2818474  A1  *  12/2014  ........ H01L 21/02592

* cited by examiner

*Primary Examiner* — Clinton A Brooks
*Assistant Examiner* — Kofi Adzamli
(74) *Attorney, Agent, or Firm* — S. Matthew Cairns

(57) ABSTRACT

The present invention provides processes for preparing silanylamines, such as disilanylamines and polysilanylamines, and compositions comprising the silanylamines. In one embodiment, the present invention provides processes for preparing a silanylamine compound, the processes comprising reacting a starting compound of general formula $RR^1N—(Si_xH_{2x+1})$ with an amine compound of general formula $R^2R^3NH$ to produce the silanylamine compound of general formula $R^2{}_mR^3{}_n—N(Si_xH_{2x+1})_{3-m-n}$.

9 Claims, No Drawings

SYNTHESIS OF DISILANYLAMINES THROUGH TRANSAMINATION

CROSS REFERENCE TO RELATED APPLICATIONS

This application is a U.S. national stage filing under 35 U.S.C. § 371 of PCT Application No. PCT/US16/067127 filed on 16 Dec. 2016, currently pending, which claims the benefit of U.S. Provisional Patent Application No. 62/269,286 filed 18 Dec. 2015 under 35 U.S.C. § 119 (e). PCT Application No. PCT/US16/067127 and U.S. Provisional Patent Application No. 62/269,286 are hereby incorporated by reference.

Precursor compounds and materials are generally used in deposition applications. Deposition applications include chemical or physical vapor deposition. Precursor compounds may be deposited via chemical vapor deposition to make films on many types of substrates, such as silicon wafers and other electronic components. Many factors influence the properties of films including nature of the substrate, methods and conditions of deposition, as well as the properties of the precursor compounds.

Drawbacks exist in deposition applications. For example, certain precursors pose problems in handling and usage. Use of certain precursors create films that may contain certain impurities from side reactions that produce byproducts. Byproducts may include dangerous components, for example, hydrogen and chlorine compounds.

Disilanylamines can be used for depositing of silicon-containing films. Such films include films having amorphous silicon, crystalline silicon, silicon nitride, silicon oxide, carbon doped silicon oxide, silicon carbo-nitride, and silicon oxynitride. Disilanylamines are promising chemical vapor deposition (CVD) and atomic layer deposition (ALD) precursors for depositing Si-containing thin films. For example, disilanylamines can be used to deposit Si, SiO, $SiO_2$, SiON or SiN films on various substrates, such as 3D NAND devices.

Only a limited number of disilanylamines have been made and there is a need for more commercially viable and technically useful methods to make a variety of disilanylamines and polysilanylamines materials. The need exists for new disilanylamines and polysilanylamines that can provide superior application performance and superior film properties.

SUMMARY OF THE INVENTION

The present invention provides processes for preparing silanylamines, such as disilanylamines and polysilanylamines. The invention also provides compositions comprising silanylamines.

In one embodiment, the present invention provides processes for preparing a silanylamine compound, the processes comprising reacting a starting compound of general formula $$RR^1N—(Si_xH_{2x+1}) \qquad (I)$$

with an amine compound of general formula $$R^2R^3NH \qquad (II)$$

to produce the silanylamine compound of general formula $$R^2{}_mR^3{}_n—N(Si_xH_{2x+1})_{3-m-n} \qquad (III)$$

wherein
R and $R^1$ are independently a hydrogen, substituted or unsubstituted aryl group having 6 to 10 carbon atoms, substituted or unsubstituted alkyl group having 1 to 10 carbon atoms, or substituted or unsubstituted cycloalkyl group having 5 to 10 carbon atoms;
$R^2$ and $R^3$ are independently a hydrogen, substituted or unsubstituted aryl group having 6 to 10 carbon atoms, substituted or unsubstituted alkyl group having 1 to 10 carbon atoms, substituted or unsubstituted cycloalkyl group having 5 to 10 carbon atoms, or a silane of formula —$Si_xH_{2x+1}$;
x is an integer from 2 to 10; and
m or n are independently 0, 1 or 2 and m+n is 2 or less.

In another embodiment, the present invention provides silanylamine compounds of general formula $$R^2{}_mR^3{}_n—N(Si_xH_{2x+1})_{3-m-n} \qquad (III)$$

wherein
$R^2$ and $R^3$ are independently a hydrogen, substituted or unsubstituted aryl group having 6 to 10 carbon atoms, substituted or unsubstituted alkyl group having 1 to 10 carbon atoms, substituted or unsubstituted cycloalkyl group having 5 to 10 carbon atoms; x is 2-10; and
m or n are independently 0, 1 or 2 and m+n is 2 or less.

DETAILED DESCRIPTION OF THE INVENTION

This invention is about a novel synthetic method developed from transamination and use of this method to make a list of silanylamines. In one embodiment, the present invention provides processes for preparing a silanylamine compound, the processes comprising reacting a starting compound of general formula $$RR^1N—(Si_xH_{2x+1}) \qquad (I)$$

with an amine compound of general formula $$R^2R^3NH \qquad (II)$$

to produce the silanylamine compound of general formula $$R^2{}_mR^3{}_n—N(Si_xH_{2x+1})_{3-m-n} \qquad (III)$$

wherein
R and $R^1$ are independently a hydrogen, substituted or unsubstituted aryl group having 6 to 10 carbon atoms, substituted or unsubstituted alkyl group having 1 to 10 carbon atoms, or substituted or unsubstituted cycloalkyl group having 5 to 10 carbon atoms;
$R^2$ and $R^3$ are independently a hydrogen, substituted or unsubstituted aryl group having 6 to 10 carbon atoms, substituted or unsubstituted alkyl group having 1 to 10 carbon atoms, substituted or unsubstituted cycloalkyl group having 5 to 10 carbon atoms, or a silane of formula —$Si_xH_{2x+1}$;
x is an integer from 2 to 10; and m or n are independently 0, 1 or 2 and m+n is 2 or less.

In this invention, transamination is demonstrated to be a universal method to make five structures of disilanylamines in Table 1 except Structure IV. The transamination of diisopropyldisilanylamine (DPDS) with a secondary amine forms a Structured disilanylamine through Equation 1, with a primary amine forms a Structure-II or Structure-III disilanylamines through Equation 2, or with ammonia forms Structure-V or VI disilanylamines through Equation 3. Table 2 shows the % GC conversions of the transamination with a variety of transaminating agents achieved after 30 minutes at room temperature. The low % GC conversions in some cases have been improved through method optimization (the data are not reported herein, but available). The transaminated products have been characterized with GC-MS and ¹H NMR. Most of the products are compositionally new species. Several of the new species have been isolated and purified to electronic grade using standard purification methods such as distillation.

Structures of Disilanylamines

Disilanylamines are a family of molecules having the generic structure $NR_mR'_n(SiH_2SiH_3)_{3-m-n}$ where R and R' can be hydrogen or any hydrocarbyl groups; m, n can be 0, 1 or 2. The family includes mono(disilanyl)amines, bis(disilanyl)amines and tris(disilanyl)amine which are represented with the 6 structures in Table 1.

TABLE 1

| Categories of Disilanylamines | Structures | |
| --- | --- | --- |
| | Organic | Inorganic |
| Mono(disilanyl)amines | (Structure-I) where R, R' can be the same or different hydrocarbyl groups | (Structure-IV) CAS# 15177-85-2 |
| Bis(disilanyl)amines | (Structure-III) where R is a hydrocarbyl group | (Structure-V) CAS# 15391-50-1 |
| Tris(disilanyl)amine | N/A | (Structure-VI) CAS# 14635-45-1 |

(Also Structure-II where R is a hydrocarbyl group, under Mono(disilanyl)amines/Organic continued.)

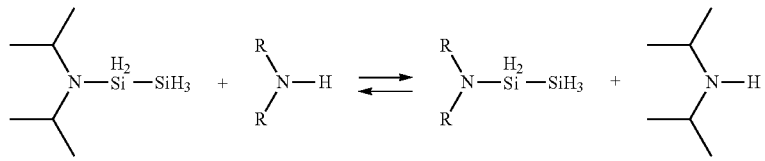

(Equation 1)

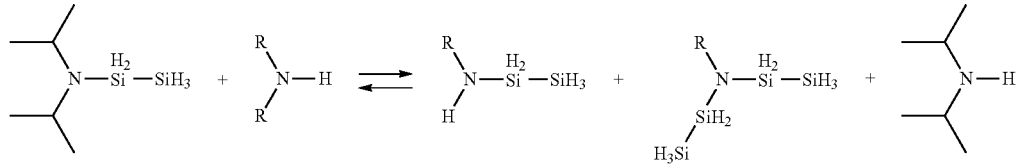

(Equation 2)

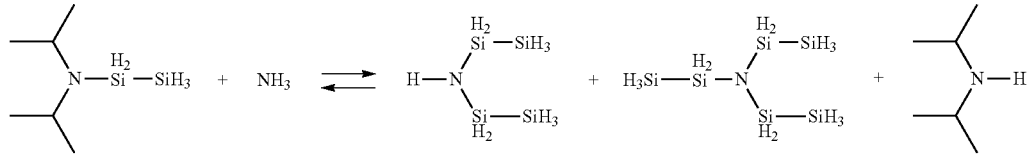

(Equation 3)

TABLE 2

Synthesis of Structures-I, II, III, V and VI disilanylamines through transamination of diisopropylaminodisilane (DPDS)

| Transaminating Agents (molar ratio to DPDS) | % GC Conversions to Products after 30 min @ RT | | | |
| --- | --- | --- | --- | --- |
| | Monodisilanyl | Bis(disilanyl) | Tris(disilanyl) | Total |
| Diethylamine (2:1) | 38.8 | n/a | n/a | 38.8 |
| Methylamine (2:1) | 69.4 | 22.0 | n/a | 100.0 |

TABLE 2-continued

Synthesis of Structures-I, II, III, V and VI disilanylamines through transamination of diisopropylaminodisilane (DPDS)

| Transaminating Agents (molar ratio to DPDS) | % GC Conversions to Products after 30 min @ RT | | | |
|---|---|---|---|---|
| | Monodisilanyl | Bis(disilanyl) | Tris(disilanyl) | Total |
| Ethylamine (2:1) | 73.7 | 23.8 | n/a | 100.0 |
| Propylamine (2:1) | 62.5 | 21.0 | n/a | 100.0 |
| Butylamine (2:1) | 71.3 | 25.0 | n/a | 100.0 |
| 2-Aminobutane (2:1) | 96.9 | 1.0 | n/a | 99.5 |
| Pentylamine (2:1) | 51.2 | 13.2 | n/a | 100.0 |
| 2-Aminopentane (2:1) | 95.2 | 0.8 | n/a | 99.2 |
| 3-Aminopentane (2:1) | 97.7 | 0 | n/a | 99.7 |
| 1,2-Dimethylpropylamine (2:1) | 98.0 | 0 | n/a | 100.0 |
| t-Pentylamine (2:1) | 83.2 | 0 | n/a | 84.3 |
| Cyclopentylamine (2:1) | 84.3 | 12.3 | n/a | 99.4 |
| Cyclohexylamine (2:1) | 92.2 | 5.1 | n/a | 99.8 |
| Aniline (1:1) | 74.1 | 0 | n/a | 75.7 |
| o-toluidine (1:1) | 38.6 | 0 | n/a | 40.7 |
| 2,6-Dimethylaniline (1:1) | 35.0 | 0 | n/a | 35.0 |
| Ammonia (1:3 or 3:1) | 0 | Near 100% | 0 | ~100% |
| Bis-disilanylamine (1:1) | 0 | 0 | Near 100% | ~100% |

Even though the transamination method is demonstrated with DPDS, this method should be extendable to other amino functional hydrido higher silane starting materials to make existing or new materials. For example, a material with the formula $Si_xH_y(NRR')_z$ where R and R' are H or hydrocarbyl groups, x is at least 2, and y and z vary can be transaminated with ammonia, a primary amine or a secondary amine to form a range of existing or new materials.

EXAMPLES

Example 1. Synthesis of Disilanyldiethylamine

To a Schlenk tube was loaded 0.65 g (8.92 mmol) of diethylamine. Then 0.72 g (4.46 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanyldiethylamine was formed in 38.8% conversion. The GC-MS confirmed the composition of disilanyldiethylamine.

Example 2. Synthesis of Disilanylmethylamine and Bis(Disilanyl)Methylamine

To a Schlenk tube was loaded 3.10 ml 2.0 M solution (6.20 mmol) of methylamine in THF. Then 0.50 g (3.10 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanylmethylamine and bis(disilanyl)methylamine were formed in 69.4% and 22.0% conversions respectively. The GC-MS confirmed the compositions of the dislanylmethylamine and bis(disilanyl)methylamine.

Example 3. Synthesis of Disilanylethylamine and Bis(Disilanyl)Ethylamine

To a Schlenk tube was loaded 2.60 ml 2.0 M solution (5.20 mmol) of ethylamine in THF. Then 0.42 g (2.60 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanylethylamine and bis(disilanyl)ethylamine were formed in 73.7% and 23.8% conversions respectively. The GC-MS confirmed the compositions of the dislanylmethylamine and bis(disilanyl)methylamine.

Example 4. Synthesis of Disilanylpropylamine and Bis(Disilanyl)Propylamine

To a Schlenk tube was loaded 0.62 g (10.4 mmol) of propylamine. Then 0.84 g (5.20 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanylpropylamine and bis(disilanyl)propylamine were formed in 62.5% and 21.0% conversions respectively. The GC-MS confirmed the compositions of disilanylpropylamine and bis(disilanyl)propylamine.

Example 5. Synthesis of Disilanylbutylamine and Bis(Disilanyl)Butylamine

To a Schlenk tube was loaded 0.77 g (10.5 mmol) of butylamine. Then 0.85 g (5.27 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanylbutylamine and bis(disilanyl)butylamine were formed in 71.3% and 25.0% conversions respectively. The GC-MS confirmed the compositions of disilanylbutylamine and bis(disilanyl)butylamine.

Example 6. Synthesis of Disilanyl(Sec-Butyl)Amine and Bis(Disilanyl)(Sec-Butyl)Amine To a Schlenk tube was loaded 0.80 g (10.9 mmol) of 2-aminobutane. Then 0.88 g (5.45 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanyl(sec-butyl)amine and bis(disilanyl)(sec-butyl)amine were formed in 96.9% and 1.0% conversions respectively. The GC-MS confirmed the compositions of disilanyl(sec-butyl)amine and bis(disilanyl)(sec-butyl)amine.

Example 7. Synthesis of Disilanylpentylamine and Bis(Disilanyl)Pentylamine

To a Schlenk tube was loaded 0.86 g (9.91 mmol) of pentylamine. Then 0.80 g (4.96 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanylpentylamine and bis(disilanyl)pentylamine were formed in 51.2% and 13.2% conversions respectively. The GC-MS confirmed the compositions of disilanylpentylamine and bis(disilanyl)pentylamine.

Example 8. Synthesis of Disilanyl(1-Methylbutyl)Amine and Bis(Disilanyl)(1-Methylbutyl)Amine To a Schlenk tube was loaded 0.96 g (11.0 mmol) of 2-aminopentane. Then 0.89 g (5.51 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanyl(1-methylbutyl)amine and bis(disilanyl)(1-methylbutyl)amine were formed in 95.2% and 0.8% conversions respectively. The GC-MS confirmed the compositions of disilanyl(1-methylbutyl)amine and bis(disilanyl)(1-methylbutyl)amine.

Example 9. Synthesis of Disilanyl(1-Ethylpropyl)Amine

To a Schlenk tube was loaded 0.78 g (4.83 mmol) of disilanyl(di-isopropyl)amine. Then 0.84 g (9.67 mmol) of 3-aminopentane was added dropwise in 1 minute at room temperature. After agitated for 30 minutes, the product was sampled for GC-FID and GC-MS analysis.

Based on the GC-FID integrations, disilanyl(1-ethylpropyl)amine was formed in 97.7% conversion. The GC-MS confirmed the composition of disilanyl(1-ethylpropyl)amine.

Example 10. Synthesis of Disilanyl(1,2-Dimethylpropyl)Amine

To a Schlenk tube was loaded 0.93 g (10.7 mmol) of 1,2-diemthylpropylamine. Then 0.86 g (5.33 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanyl(1,2-dimethylpropyl)amine was formed in 98.0% conversion. The GC-MS confirmed the composition of disilanyl(1,2-dimethylpropyl)amine.

Example 11. Synthesis of Disilanyl(Tert-Pentyl)Amine

To a Schlenk tube was loaded 0.76 g (4.71 mmol) of disilanyl(di-isopropyl)amine. Then 0.82 g (9.42 mmol) of tert-pentylamine was added dropwise in 1 minute at room temperature. After agitated for 30 minutes, the product was sampled for GC-FID and GC-MS analysis. Based on the GC-FID integrations, disilanyl(tert-pentyl)amine was formed in 83.2% conversion. The GC-MS confirmed the composition of disilanyl(tert-pentyl)amine.

Example 12. Synthesis of Disilanyl(Cyclo-Pentyl)Amine and Bis(Disilanyl)(Cyclo-Pentyl)Amine To a Schlenk tube was loaded 0.89 g (5.51 mmol) of disilanyl(di-isopropyl)amine. Then 0.94 g (11.0 mmol) of cyclo-pentylamine was added dropwise in 1 minute at room temperature. After agitated for 30 minutes, the product was sampled for GC-FID and GC-MS analysis. Based on the GC-FID integrations, disilanyl(cyclo-pentyl)amine and bis(disilanyl)(cyclo-pentyl)amine were formed in 84.3% and 12.3% conversions respectively. The GC-MS confirmed the compositions of disilanyl(cyclo-pentyl)amine and bis(disilanyl)(cyclo-pentyl)amine.

Example 13. Synthesis of Disilanyl(Cyclo-Hexyl)Amine and Bis(Disilanyl)(Cyclo-Hexyl)Amine To a Schlenk tube was loaded 0.77 g (4.77 mmol) of disilanyl(di-isopropyl)amine. Then 0.95 g (9.54 mmol) of cyclo-hexylamine was added dropwise in 1 minute at room temperature. After agitated for 30 minutes, the product was sampled for GC-FID and GC-MS analysis. Based on the GC-FID integrations, disilanyl(cyclo-hexyl)amine and bis(disilanyl)(cyclo-hexyl)amine were formed in 92.2% and 5.1% conversions respectively. The GC-MS confirmed the compositions of disilanyl(cyclo-hexyl)amine and bis(disilanyl)(cyclo-hexyl)amine.

Example 14. Synthesis of Disilanylphenylamine

To a Schlenk tube was loaded 0.85 g (5.27 mmol) of disilanyl(di-isopropyl)amine. Then 0.49 g (5.27 mmol) of aniline was added dropwise in 30 seconds at room temperature. After agitated for 30 minutes, the product was sampled for GC-FID and GC-MS analysis. Based on the GC-FID integrations, disilanylphenylamine was formed in 74.1% conversion. The GC-MS confirmed the composition of disilanylphenylamine.

Example 15. Synthesis of Disilanyl(2-Methylphenyl)Amine

To a Schlenk tube was loaded 0.82 g (5.08 mmol) of disilanyl(di-isopropyl)amine. Then 0.54 g (5.08 mmol) of o-toluidine was added dropwise in 1 minute at room temperature. After agitated for 30 minutes, the product was sampled for GC-FID and GC-MS analysis. Based on the GC-FID integrations, disilanyl(2-methylphenyl)amine was formed in 38.6% conversion. The GC-MS confirmed the composition of disilanyl(2-methylphenyl)amine.

Example 16. Synthesis of Disilanyl(2,6-Di Methylphenyl)Amine

To a Schlenk tube was loaded 0.69 g (5.70 mmol) of 2,6-dimethylaniline. Then 0.92 g (5.70 mmol) of disilanyl(di-isopropyl)amine was added dropwise in 1 minute at room temperature. After agitated for 30 minutes, the product was sampled for GC-FID and GC-MS analysis. Based on the GC-FID integrations, disilanyl(2,6-dimethylphenyl)amine was formed in 35.0% conversion. The GC-MS confirmed the composition of disilanyl(2,6-dimethylphenyl)amine.

Example 17. Synthesis of Bis(Disilanyl)Amine

To a 250 ml Parr reactor was loaded 66.6 g (0.413 mol) of disilanyl(di-isopropyl)amine. Then 5.28 g (0.310 mol) of ammonia was bubbled in 10 minute at room temperature. After agitated for 1 hour, the pressure in the Parr reactor was vented and the Parr reactor was opened. The product was sampled for GC-TCD and GC-MS analysis. Based on the GC-TCD integrations, bis(disilanyl)amine was formed in 90% conversion. The GC-MS confirmed the composition of bis(disilanyl)amine.

Example 18. Synthesis of Tris(Disilanyl)Amine Through Transamination

To a 100 ml round bottom flask was loaded 5.99 g of the product prepared in Example 17. The product contained 2.29 g (16.6 mmol) of bis(disilanyl)amine. Then 2.31 g (14.3 mmol) (disilanyl)(di-isopropyl)amine was quickly added at room temperature. The reaction mixture was heated at 130° C. for 17 hours while volatile species were continuously distilled. The product was sampled for GC-TCD and GC-MS analysis. Based on the GC-TCD integrations, tris-disilanylamine was formed in 71% conversion. The GC-MS confirmed the composition of tris-disilanylamine.

Example 19. Synthesis of Tris(Disilanyl)Amine Through Thermal Redistribution

To a 100 ml round bottom flask was loaded 13.0 g (94.5 mmol) of bis(disilanyl)amine. The flask was heated at 110° C. for 18 hours. The product was sampled for GC-TCD and GC-MS analysis. Based on the GC-TCD integrations, tris (disilanyl)amine was formed in 60% conversion. The GC-MS confirmed the composition of tris(disilanyl)amine.

Example 20. Synthesis of Tris(Disilanyl)Amine Through Thermal Redistribution

To a flask was loaded bis(disilanyl)amine. The flask was heated at 110° C. for 27 hours to convert bis(disilanyl)amine to tris(disilanyl)amine and ammonia. The product was sampled for GC-TCD and GC-MS analysis. Based on the GC-TCD integrations, tris(disilanyl)amine was formed. The GC-MS confirmed the composition of tris(disilanyl)amine. The crude product was distilled in a ten-stage column to recover 98% pure tris(disilanyl)amine.

Example 21. Synthesis of Bis-Disilanylamine

To a 1.5 Liter high pressure Parr reactor was loaded 375 g of disilanyl(di-isopropyl)amine. While agitating 28 g of anhydrous ammonia was added through the dip tube port over 60 minutes semi-continuously by pressuring up to 40 psig and down to 20 psig. The reactor temperature started at 20° C. and increase to 27° C. during the addition of ammonia. The reactor was cooled to 0° over 1 hr with agitation and periodic nitrogen purging. The pressure in the Parr reactor was vented and the Parr reactor was opened. The product was sampled for GC-TCD and GC-MS analysis. Based on the GC-TCD integrations, the crude product comprises 38% bis(disilanyl)amine and 8% diisopropylaminodisilane. The GC-MS confirmed the composition of bis (disilanyl)amine. The crude product was then distilled using a 5-stage column at 150 mmHg and 60° C. to recover the bis(disilanyl)amine.

What is claimed is:

1. A process for preparing a silanylamine compound, the process comprising reacting a starting compound of general formula $$RR^1N-(Si_xH_{2x+1}) \quad (I)$$

with an amine compound of general formula $$R^2R^3NH \quad (II)$$

to produce the silanylamine compound of general formula $$R^2{}_mR^3{}_n-N(Si_xH_{2x+1})_{3-m-n} \quad (III)$$

wherein
R and $R^1$ are independently a hydrogen, substituted or unsubstituted aryl group having 6 to 10 carbon atoms, substituted or unsubstituted alkyl group having 1 to 10 carbon atoms, or substituted or unsubstituted cycloalkyl group having 5 to 10 carbon atoms;
$R^2$ is H;
$R^3$ is a silane of formula $-Si_xH_{2x+1}$;
x is an integer from 2 to 10; and
m and n are 0.

2. The process according to claim 1, wherein the starting compound of formula (I) comprises a dialkyldisilanylamine.

3. The process according to claim 1, wherein R and $R^1$ of the starting compound of formula (I) comprise a substituted or unsubstituted alkyl group having 1 to 4 carbon atoms and x is an integer from 2 to 4.

4. The process according to claim 1 or 2, wherein R and $R^1$ of the starting compound of formula (I) comprise a substituted or unsubstituted alkyl group having 1 to 3 carbon atoms and x is an integer from 2 to 3.

5. The process according to claim 1, wherein the starting compound of formula (I) comprises diisopropyldisilanylamine.

6. The process according to claim 1, wherein x is an integer from 2 to 3 in the amine compound of formula (II).

7. The process according to claim 1, wherein the amine of formula (II) is bis-disilanylamine.

8. The process according to claim 1, wherein the silanylamine compound of formula (III) comprises tris(disilanyl)amine.

9. The process according to claim 1, wherein the molar ratio of formula (II) to formula (I) is from 0.1:1 to 100:1.

* * * * *